(12) United States Patent
Wouters

(10) Patent No.: US 6,597,239 B2
(45) Date of Patent: Jul. 22, 2003

(54) OFFSET CONTROL OF AN OPERATIONAL AMPLIFIER

(75) Inventor: Patrick August Maria Wouters, Hamme-Merchtem (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/137,385

(22) Filed: May 3, 2002

(65) Prior Publication Data

US 2002/0171474 A1 Nov. 21, 2002

(30) Foreign Application Priority Data

May 18, 2001 (EP) .......................................... 01401314

(51) Int. Cl.$^7$ ................................................ H03F 1/02
(52) U.S. Cl. ............................. 330/9; 330/69; 327/124
(58) Field of Search ............................... 330/9, 69, 259; 327/124, 3–7

(56) References Cited

U.S. PATENT DOCUMENTS

| | | | |
|---|---|---|---|
| 4,229,703 A | * 10/1980 | Bustin | ........................ 328/162 |
| 4,356,450 A | * 10/1982 | Masuda | ......................... 330/9 |
| 4,358,739 A | 11/1982 | Nelson | |
| 4,439,743 A | 3/1984 | Schwarz et al. | |
| 4,476,438 A | * 10/1984 | Cantou | ........................ 330/149 |
| 4,502,020 A | 2/1985 | Nelson et al. | |
| 4,638,260 A | 1/1987 | Hamley | |
| 6,066,986 A | 5/2000 | Chao | |
| 6,225,848 B1 | * 5/2001 | Tilley et al. | ................. 327/307 |

* cited by examiner

Primary Examiner—Henry Choe
(74) Attorney, Agent, or Firm—Sughrue Mion, PLLC

(57) ABSTRACT

An operational amplifier arrangement (OA) including an operational amplifier (A) and an input offset control circuit (IOCS) is characterized in that said operational amplifier arrangement further includes a current sensing and comparison device (CSCD) adapted to measure and to compare respective output currents on series output branches of an output stage (OS) of said operational amplifier, said current sensing and comparison device (CSCD) being coupled between said output stage (OS) of said operational amplifier and said input offset control circuit (IOCS).

4 Claims, 2 Drawing Sheets ter's gate is coupled to the gate of output transistor $P1$, a mirror $N$

OFFSET CONTROL OF AN OPERATIONAL AMPLIFIER

BACKGROUND OF THE INVENTION

The present invention relates to an operational amplifier arrangement which is adapted to control the input offset voltage of an operational amplifier included therein as is described in the non-characterising portion of the first claim.

Such an operational amplifier arrangement is already known in the art, e.g. from U.S. Pat. No. 6,066,986. Therein an integrated operational amplifier device is described which includes an operational amplifier, and an input offset control circuit including means connected to this operational amplifier for providing at least one of a positive and a negative electrically adjustable input offset voltage devoid of ac. An external programming device is coupled to a user input adjust terminal, and further devices comprised within the input offset control circuit and coupled between this external programming device and the operational amplifier ensure a voltage applied to a specific bias circuit of the amplifier such that the desired output voltage is obtained.

It is however not mentioned how the adjustable input offset voltage which is the input to the external programming device, is determined. The relationship between a sensed output voltage, and the input signal to the external programming device for further delivery to the bias circuit of the amplifier is not mentioned.

Known offset control circuits thereby rely on measurements of the output voltage of the operational amplifier, whereby a comparison with a known reference voltage is performed, such as for instance described in the tutorial handbook on Analog Circuit Design such as e.g. "Design of Analog CMOS Integrated Circuits" by B. Razavi, pp 471–476.

However these existing solutions are not suited to handle the accuracy required by e.g. state-of-the-art xDSL line drivers. These drivers may see a very low resistive load, for instance merely 5–6 Ohms. For these applications a small output offset voltage results rapidly in large offset load currents, thereby increasing unnecessarily the power consumption and the distortion level of these output drivers.

SUMMARY OF THE INVENTION

An object of the present invention is therefore to provide an operational amplifier arrangement of the above known kind, but whereby a very high level of accuracy is obtained, allowing these operational amplifiers to be used for driving small loads.

According to the invention, this object is achieved due to the fact that two individual output currents in two series branches of the output stage of the amplifier are compared with each other, as is further described by the characterizing portion of the first claim.

In this way, by not just comparing the output currents with a predetermined reference, but with each other, and by further adjusting the input bias voltages of the operational amplifier such that these measured output currents become equal, a much higher accuracy is obtained.

Other characteristic features of the present invention are described in other claims.

The input offset control circuit thereby consists of a control logic circuit and a D/A converter. Compared to the prior art where a capacitor is used for storing a charge for further tuning the offset voltage, this solution does not use any capacitor. The charge stored on capacitors indeed needs to be refreshed because of leakage which presents an inherent drawback. This problem is thus also overcome with the present invention.

The above and other objects and features of the invention will become more apparent and the invention itself will be best understood by referring to the following description of an embodiment taken in conjunction with the accompanying drawings wherein:

DETAILED DESCRIPTION OF THE INVENTION

Figure 1:
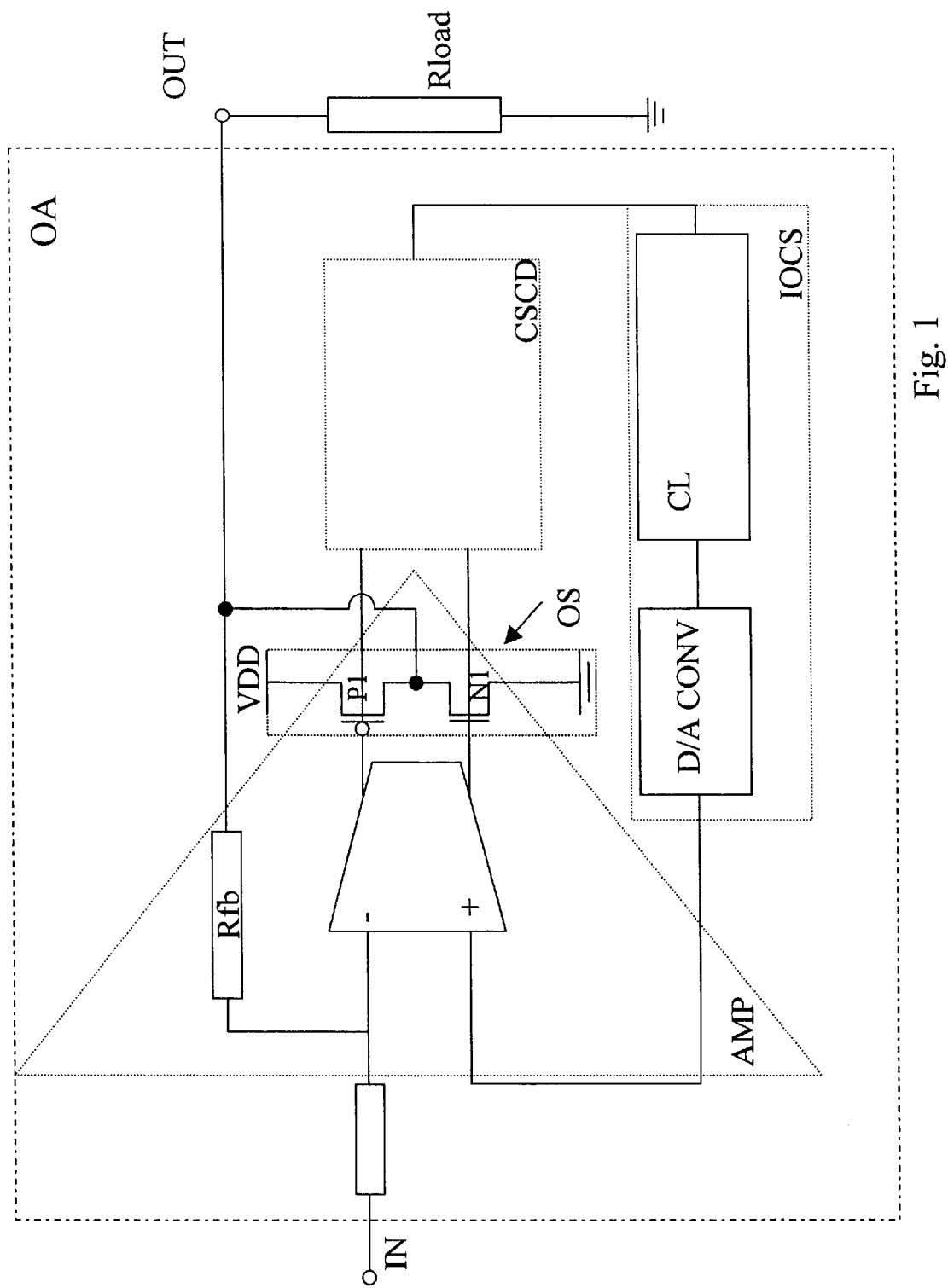
FIG. 1 represents a schematic of an operational amplifier arrangement OA of the invention, FIG. 2 gives a transistor level embodiment of the current sense and comparison device CSCD of FIG. 1.

An operational amplifier arrangement OA of the present invention is schematically depicted in FIG. 1. This arrangement has an input terminal IN, an output terminal OUT, which is coupled via a feedback circuit depicted as Rfb to the input terminal IN, and which is coupled to an external load, schematically depicted by Rload. OA basically includes an operational amplifier AMP, a current sensing and comparison device CSCD, and an input offset control circuit IOCS. The current sensing and comparison device is adapted to sense the output currents of two series branches of the output stage of the operational amplifier. In the embodiment depicted in FIG. 1 this output stage OS consists of a standard class AB output stage, including a pMOS transistor P1 in series with an nMOS transistor N1. The two series branches thereby merely consist of the drain-source paths of these transistors P1 and N1. However the invention is applicable to any output stage including two series branches.

Figure 2:
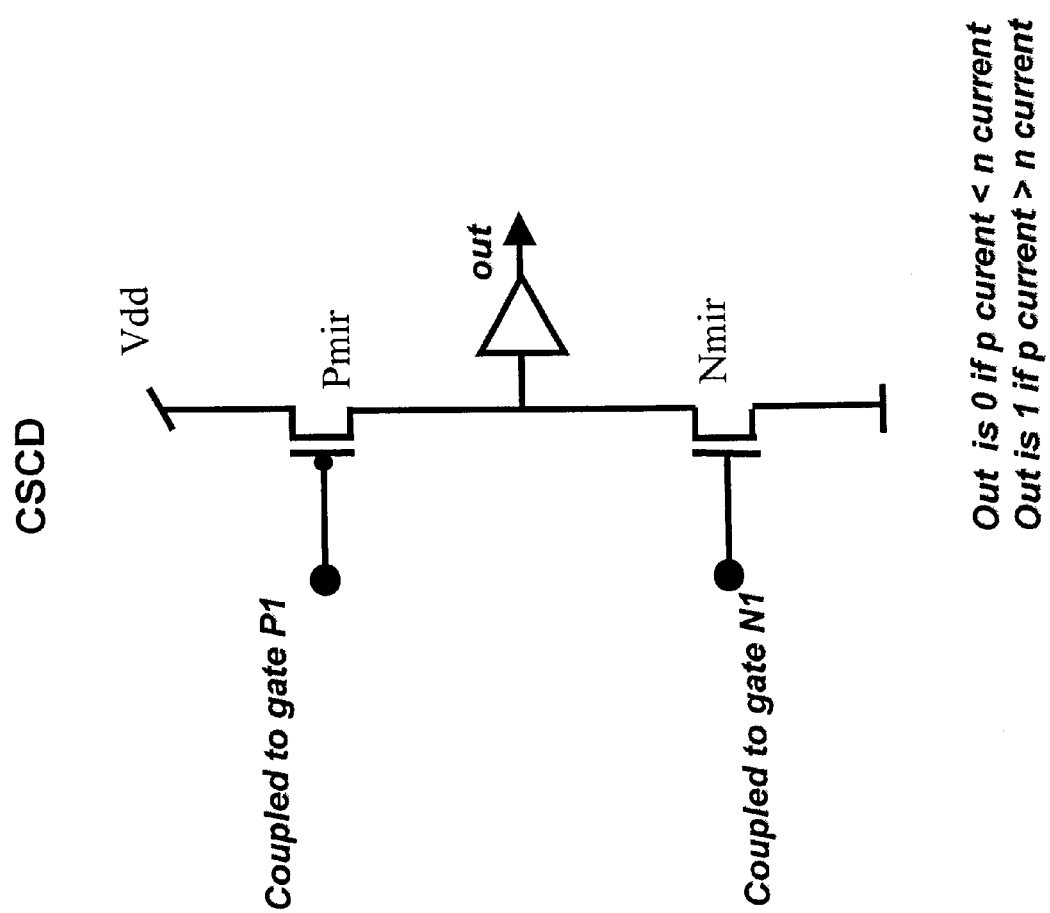

The current through P1 and N1 is sensed within CSCD. In the embodiment depicted in FIG. 2, this device merely consists of a inverter coupled to an amplifier. This inverter includes a mirror P transistor Pmir, of which the gate is coupled to the gate of the output transistor P1, a mirror N transistor Nmir, of which the gate is coupled to the gate of output transistor N1. The currents through resp. Pmir and Nmir are proportional to the currents through P1 and N1, which is realised by proportionality of the dimensions between P1/N1 and Pmir/Nmir respectively. Furthermore the amplifier of CSCD is coupled to the intersection node between Pmir and Nmir. The operation of the amplifier is such that, if the current through P1/Pmir is smaller than the current through N1/Nmir, the output of the amplifier is low. Similarly if the current through P1/Pmir is larger than the current through N1/Nmir, the output will be high. However other current sensing and comparison techniques can be used as they are widely known in the art. They will therefore not be further described within this document.

In the previously described embodiment, the output signal of CSCD is thus indicative of the fact that one of the currents in the series branches is lower or higher than the other. However also more quantitative output signals can be provided by other embodiments, indicative of the relative or absolute difference between both currents.

In any case the signal provided by CSCD serves as an input signal to the input offset control circuit IOCS. In the embodiment depicted in FIG. 1 this input offset control circuit itself includes two main building blocks: a control logic block CL and a digital to analog converter D/A CONV.

The function of the control logic is to adapt the level or code of the D/A converter such that the resulting analog voltage which is further applied to an input terminal of the amplifier AMP, results in an appropriate change of the output currents through N1/P1. If the current through P1 was initially higher than the current through N1, the control logic device CL will then adapt the D/A converter code such that the current through P1 will decrease and the current through N1 will increase. Depending on the specific embodiments for CSCD and CL, CL can adapt the code of the D/A converter with the finest granularity, i.e. bit per bit, or may be adapted to select the granularity with which to adapt the code. At the end, the currents through P1 and N1 will however be equal to the extent of the resolution of the D/A converter.

An additional advantage of this solution is that the offset voltage control can be done off-line, thus when no input signal is present at the input terminal IN of the operational amplifier arrangement OA. A measurement of both currents can thus be done during start-up of the amplifier arrangement, when the supply voltages are coupled to the supply voltage terminals, but when no input signals are applied. When during start-up the current through Pmir, being the mirrored current of the current through P1, is larger than the current through Nmir, which is the mirrored current of the current through N1, the output voltage of the amplifier is too high, and the D/A voltage will be lowered resulting in a lowering of the output voltage. When the opposite is true, the output voltage of the amplifier arrangement OA is too low and the D/A converter voltage will be increased such as to further increase the output voltage. In these respective cases the D/A converter code will be decreased, resp. increased, step by step until the value of the amplifier of CSCD changes from high to low, resp. low to high.

It is to be remarked that, although this invention was described for a single-ended operational amplifier arrangement, this is as well possible for differential, double differential and other amplifier arrangement configurations.

While the principles of the invention have been described above in connection with specific apparatus, it is to be clearly understood that this description is made only by way of example and not as a limitation on the scope of the invention, as defined in the appended claims.

What is claimed is:

1. An operational amplifier arrangement (OA) including an operational amplifier (AMP) and an input offset control circuit (IOCS)

characterized in that said operational amplifier comprises an output stage (OS) having two series output branches carrying respective output currents, and said operational amplifier arrangement further includes a current sensing and comparison device (CSCD) adapted to measure and to compare said respective output currents in said two series output branches of said output stage (OS) of said operational amplifier, said current sensing and comparison device (CSCD) being coupled between said output stage (OS) of said operational amplifier and said input offset control circuit (IOCS).

2. The operational amplifier arrangement (GA) according to claim 1, characterized in that said input offset control circuit (IOCS) includes a control logic device (CL), an input terminal of which is coupled to an output terminal of said current sensing and comparison device (CSCD), and an output terminal of which is coupled to a D/A converter of said input offset control circuit (IOCS).

3. The operational amplifier arrangement (OA) according to claim 2 characterized in that said D/A converter is coupled to an input terminal of said operational amplifier and is adapted to provide a voltage to said input terminal of said operational amplifier to cause said respective output currents in said series output branches of said operational amplifier to be equal.

4. The operational amplifier arrangement according to claim 1, wherein said two series output branches comprise drain-source paths of a pMOS transistor and a nMOS transistor, respectively.

* * * * *